United States Patent [19]

Holt et al.

[11] Patent Number: 5,030,869
[45] Date of Patent: Jul. 9, 1991

[54] DEVICE TESTING SYSTEM WITH CABLE PIVOT

[75] Inventors: Alyn R. Holt; Robert E. Matthiessen, both of Cherry Hill, N.J.

[73] Assignee: inTEST Corporation, Cherry Hill, N.J.

[21] Appl. No.: 558,144

[22] Filed: Jul. 25, 1990

[51] Int. Cl.$^5$ .............................................. G01R 1/00
[52] U.S. Cl. ................................ 324/158 F; 324/72.5; 324/158 P
[58] Field of Search ...................... 414/222, 225; 901/8, 901/44; 324/158 P, 158 F, 72.5

[56] References Cited

U.S. PATENT DOCUMENTS

| | | |
|---|---|---|
| 3,128,887 | 2/1961 | Guennec et al. . |
| 4,160,207 | 7/1979 | Haines . |
| 4,517,512 | 5/1985 | Petrich et al. . |
| 4,527,942 | 7/1985 | Smith . |
| 4,588,346 | 5/1986 | Smith . |
| 4,589,815 | 5/1986 | Smith . |
| 4,650,391 | 3/1987 | Adlon et al. ........................ 414/222 |
| 4,665,360 | 5/1987 | Phillips . |
| 4,705,447 | 11/1987 | Smith . |
| 4,857,838 | 8/1989 | Willberg .......................... 324/158 F |
| 4,893,074 | 1/1990 | Holt et al. . |

OTHER PUBLICATIONS inTEST ® Brochure on in2 Test head Positioner, 12/1985.
inTEST ® Applications Manual, Oct. 1989.
inTEST ® Sales Brochure, Apr. 28, 1989.

Primary Examiner—Kenneth Wieder
Assistant Examiner—William J. Burns
Attorney, Agent, or Firm—Ratner & Prestia

[57] ABSTRACT

A device testing system of the type in which an electronic test head is mounted for pivotal movement about three orthogonal axes. Cables are connected between a test cabinet and the test head to carry electronic signals. The test head is directly mounted to, and the cable is introduced to the test head through, a split ring cable pivot.

11 Claims, 5 Drawing Sheets

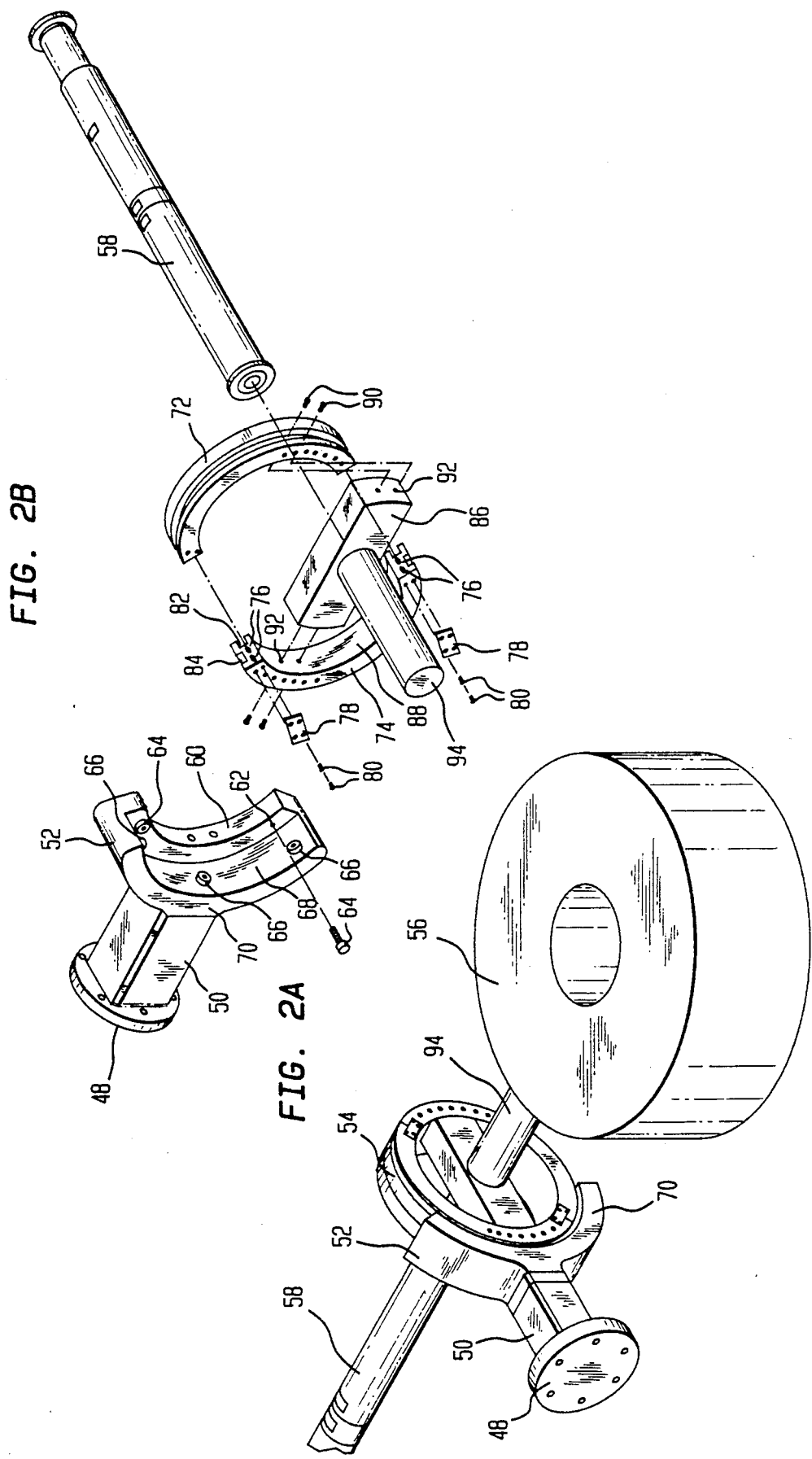

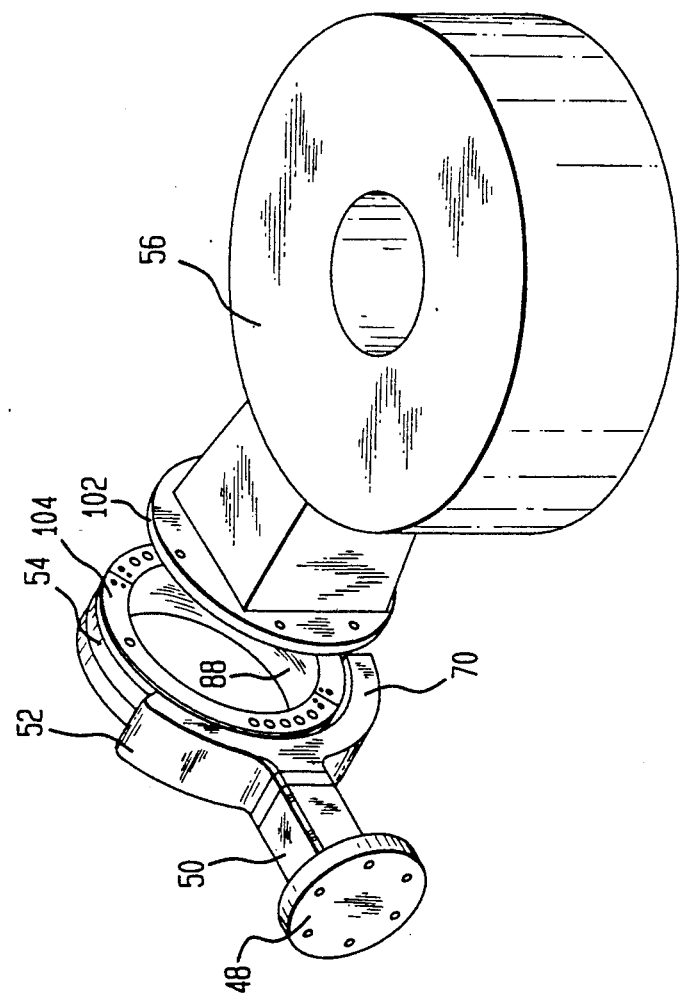

DEVICE TESTING SYSTEM WITH CABLE PIVOT

BACKGROUND OF INVENTION

A. Field of Invention

The present invention relates, in general, to a system for testing electronic devices in which an electronic test head is positioned to connect to and dock with a handler of the device to be tested. More specifically, this invention relates to a pivot by which cable can be attached to and move with a movable test head.

B. Description of Related Art

In the automatic testing of integrated circuits and other electronic devices, special device handlers have been used which place the device to be tested in position. The electronic testing itself is done by a large and expensive automatic testing system which includes a test head which connects to and docks with the device handler. The test head uses high speed electronic timing signals so that the electronic circuits must be located as close as possible to the device under test. Accordingly, the test head is densely packaged with electronic circuits in order to achieve the high speed testing of the sophisticated devices.

A positioner, able to move along a support structure, carries the test head to the desired location at which the test head is positioned to connect to and dock with the device handler. The test head is attached to the positioner so that the test head can achieve six degrees of freedom.

A major problem is connecting a heavy cable, extending from a cabinet containing part of the automatic testing system, into the test head. Because the test head can be moved to a desired location and into a desired position, the heavy cable must move with the test head.

Conventional arrangements used to provide synchronized movement between the test head and cable fall generally into two categories: cable pivot-type and tumble-type arrangements.

In the tumble type, the cable is slung beneath the test head so that it connects to the side of the test head opposite the mechanism by which the test head is attached, at its center of gravity, to the positioner. This arrangement avoids the complexity and expense of a cable-pivot type approach. It allows the cable to hang beneath the test head to beyond the side of the test head, however, for a number of different orientations of the test head. Thus, the cable often gets in the way of the operator of the test system and very large test systems are limited in how low they may be positioned before the cables will touch the floor when the test head is in its down position. Moreover, the tumble-type arrangement requires a lengthy cable because it extends completely across the bottom of the test head for certain orientations of the test head.

A variety of cable pivot-type arrangements are known. In one, the test head is also held at its center of gravity by the positioner. The cable and positioner are attached to the test head on opposite ends of the test head. One disadvantage of this type of arrangement is that it cannot access, from underneath, horizontal plane handlers which are built like two pedestal office desks; the positioner stands where one pedestal of such a desk would be located.

A second cable pivot-type arrangement involves passing the cable through the mechanism by which the test head is attached to the positioner. This mechanism is arranged to permit pivotal movement of the test head. Typically, such mechanisms include an inner ring which, through bearings, is spaced from and able to rotate in an outer ring. One disadvantage of these mechanisms is that installation or removal of the test head requires that the cables be unplugged from the test system. The task of decabling and recabling a test system may take one half to one full day, puts a very expensive system out of commission, and risks damage. Another disadvantage is that the mechanism is expensive: the bearings themselves and the precise machining necessary to load the bearings in the ring are costly.

In order to avoid the necessity of unplugging the cables, it is known to provide the rings as split rings, connected by a C-clamp. When connected, the geometry of the split-ring components makes it difficult to mount the ring directly to the test head; instead, additional structure is required to mount the test head to the inner diameter of the ring.

With the above discussion in mind, it is one object of the present invention to provide a device testing system which protects the cables which interconnect the test head to the test system. Continual bending, twisting, and insertion/removal of such cables is inherent when the system is used to test a variety of probers and handlers. Accordingly, the fatigue life of the cables is an important concern. Because fatigue life of materials from which cables are made decreases with increasing stress and the applied stress is proportional to the length of cable over which a bend or twist occurs, it is advantageous to control the length of the cable encompassing the bend or twist.

Another object is safety and ease of operation of the test head positioning system. Related objects are to allow installation or removal of the test head without unplugging the test head cable from the test system and to provide a system which properly balances the test head in the cable pivot arrangement for acceptable handling. Still another object is to provide a system able to test a variety of probers and handlers, including those built like pedestal desks, and to position especially large test heads low to the ground without having the cables touch the floor. It is also advantageous to allow mounting of the test head directly to the cable pivot arrangement. Finally, an object of the present invention is to provide a system which can be manufactured cost efficiently, especially by eliminating alignment tolerance requirements.

SUMMARY OF THE INVENTION

To achieve these and other objects, and in view of its purposes, the present invention provides a device testing system with a support structure and a positioner able to move along that support structure. Also included is a cable pivot housing defining a substantially circular passage and having a flange on only one side, so that the passage is partly closed on that side and completely open on the opposite side. A test head adapter ring having two connected halves is rotatably positioned in the passage of the housing. The testing system further includes a test head, attached to the test head adapter ring so that pivotal movement of the test head is permitted; a test cabinet; a cable connected between the test cabinet and the test head and passing through the test head adapter ring; and a cable support.

It is to be understood that both the foregoing general description and the following detailed description are exemplary, but are not restrictive, of the invention.

BRIEF DESCRIPTION OF THE DRAWINGS

The invention is best understood from the following detailed description when read in connection with the accompanying drawings in which:

FIG. 2a is a perspective view of the test head adapter ring support structure, and of one embodiment of the attachment between the test head and the ring, of a device testing system constructed in accordance with the present invention;

FIG. 2b is a more detailed perspective view of the device testing system shown in FIG. 2a;

FIG. 3b a more detailed perspective view of the device testing system shown in FIG. 3a;

FIG. 4 is a perspective view of the test head adapter ring support structure, and of a third embodiment of the attachment between the test head and the ring, of a device testing system constructed in accordance with the present invention.

DETAILED DESCRIPTION OF THE INVENTION

Figure 1:
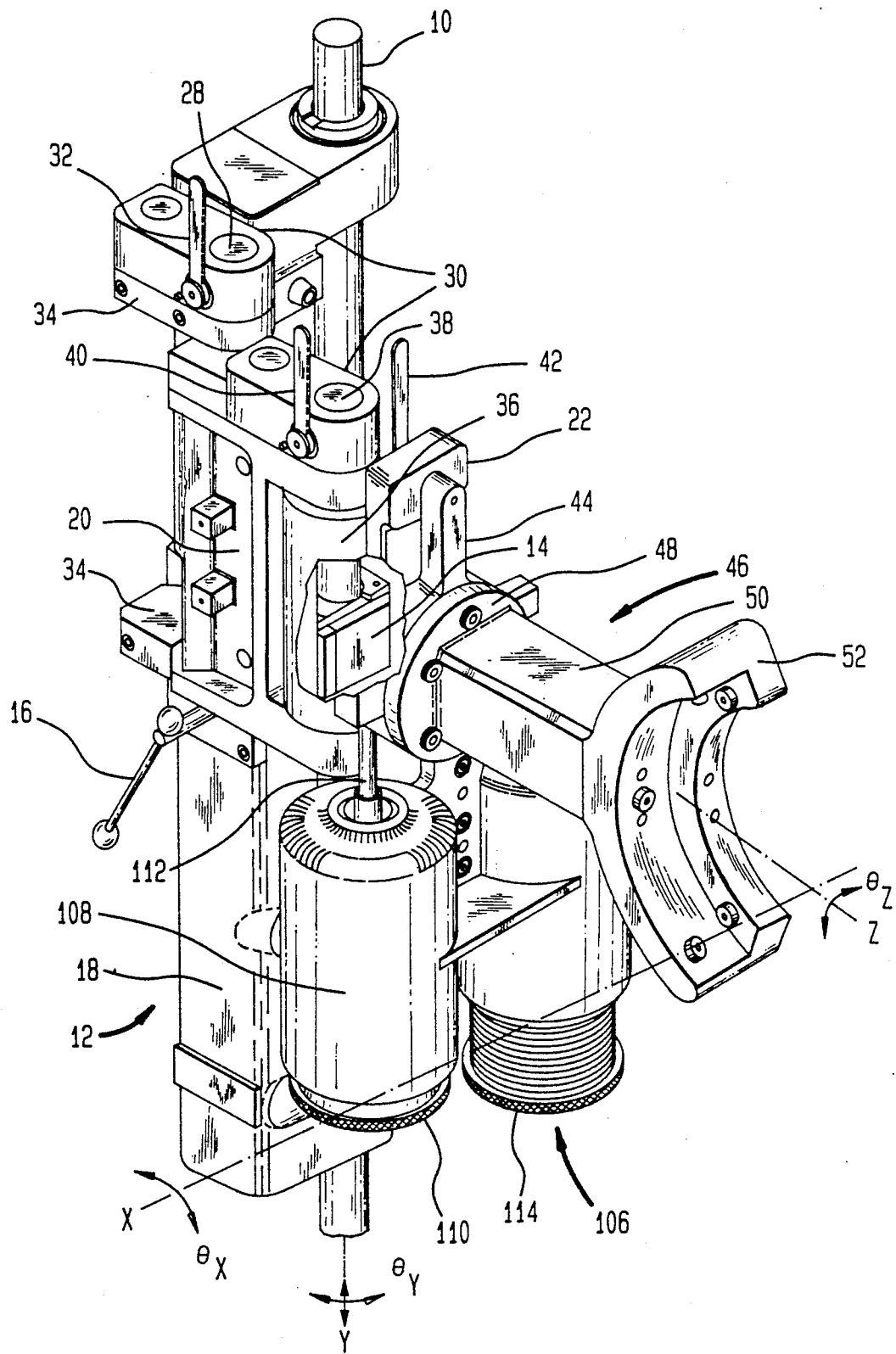
FIG. 1 is a perspective view of the support structure of a device testing system constructed in accordance with the present invention, which also shows the six degrees of freedom of the system.

FIG. 1 is a perspective view of an electronic device testing system constructed in accordance with the present invention. The system is generally similar to the one described and illustrated in U.S. Pat. Nos. 4,893,074 and 4,589,815, the contents of which are incorporated herein by reference.

The system includes a support structure (not shown) which maintains a main shaft 10 in the vertical direction (the y-direction of FIG. 1) and a positioner 12. Positioner 12 can move vertically along shaft 10 in the y-direction and can rotate about shaft 10 in the $\theta_y$ direction. Positioner 12 can be fixed relative to shaft 10 by tightening main lock collar 14 using main lock 16. Positioner 12 includes a main arm 18, a forearm assembly 20, and a wrist assembly 22. Forearm assembly 20 is attached to main arm 18 at forearm mount blocks 34 so that forearm assembly 20 can move vertically along shaft 10 in the y-direction.

Forearm assembly 20 has a vertical elbow shaft 28 displaced in the z-direction from the vertical axis along which main shaft 10 is disposed forearm assembly 20 can rotate in the $\theta_y$ direction about shaft 28 relative to main arm 18. Lock collar 30, activated by elbow lock 32, fixes forearm assembly 20 on shaft 28.

Wrist assembly 22, in turn, is attached to forearm assembly 20. Wrist assembly 22 includes a wrist housing 36 having a circular portion, through which a vertical wrist shaft 38 is disposed, and a block face. The circular portion and block face of wrist housing 36 may be formed as a single casting. Vertical wrist shaft 38 is further displaced in the z-direction from elbow shaft 28 and main shaft 10. Note that the combination of possible rotations about the three, separate, vertical shafts 10, 28, and 38 allows the test head 56 (see FIG. 2a) to be positioned along the x and z axes. Wrist assembly 22 can rotate in the $\theta_y$ direction about vertical wrist shaft 38—unless locked in place by vertical wrist lock 40.

Wrist assembly 22 can also rotate about the z axis (see FIG. 1). To prevent such rotation, horizontal wrist lock 42 can be used to fix horizontal wrist shaft 44 of wrist assembly 22 in position. Cable pivot adapter 46 is affixed to horizontal wrist shaft 44 by conventional screws, bolts, pins, or the like.

As shown in FIG. 2a, cable pivot adapter 46 is affixed to horizontal wrist shaft 44 through flange 48. Cable pivot adapter 46 includes flange 48 and a beam 50. Beam 50 is attached (welded or formed as an integral casting, for example) to flange 48 on one end and (through screws, bolts, or the like) to a cable pivot housing 52 on its opposite end, thereby connecting flange 48 and cable pivot housing 52. Cable pivot housing 52 retains test head adapter ring 54, allowing ring 54 to rotate (in the $\theta_x$ direction) within housing 52 in a manner described below. Test head 56 is attached to ring 54 in a number of possible ways, some of which are described below, allowing ring 54 to transfer movement to test head 56.

Test head 56 interacts with the electronic interface components (connectors, pogo pins, printed circuit boards, and the like) of the system to be tested (not shown). In order to protect the fragile electronic interface components from damage or excessive wear during the docking and undocking action between test head 56 and the system, motion of the test head during such action must be precisely in line with the motion axis of the electronic interface components. Accordingly, test head 56 must be able to move accurately and effortlessly in any or all of the six degrees of motion freedom of a cartesian coordinate system during the docking and undocking action. These six degrees of freedom, as shown in FIG. 1, include linear motion in the x (horizontal; left to right), y (vertical), and z (horizontal; in and out) axes and rotation about each axis in the $\theta_x$, $\theta_y$, and $\theta_z$ directions—all relative to the center of the interface board plane on which the electrical interconnect components are mounted.

The invention achieves six degrees of freedom of motion by carefully assuring that balance is maintained (as described below) on each axis of motion in the design of both the positioner 12 and the test head adapter ring 54 elements of the device testing system.

A cable, usually composed of a number of individual cables (not shown), extends into test head 56 through test head adapter ring 54. Electronic signals generated by test head 56 and power are delivered along these cables to and from a test cabinet (not shown). To carry the cables, a telescopic cable support 58 is provided. Support 58 has spherical bearings on each end which allow freedom of movement.

Figure 3B:
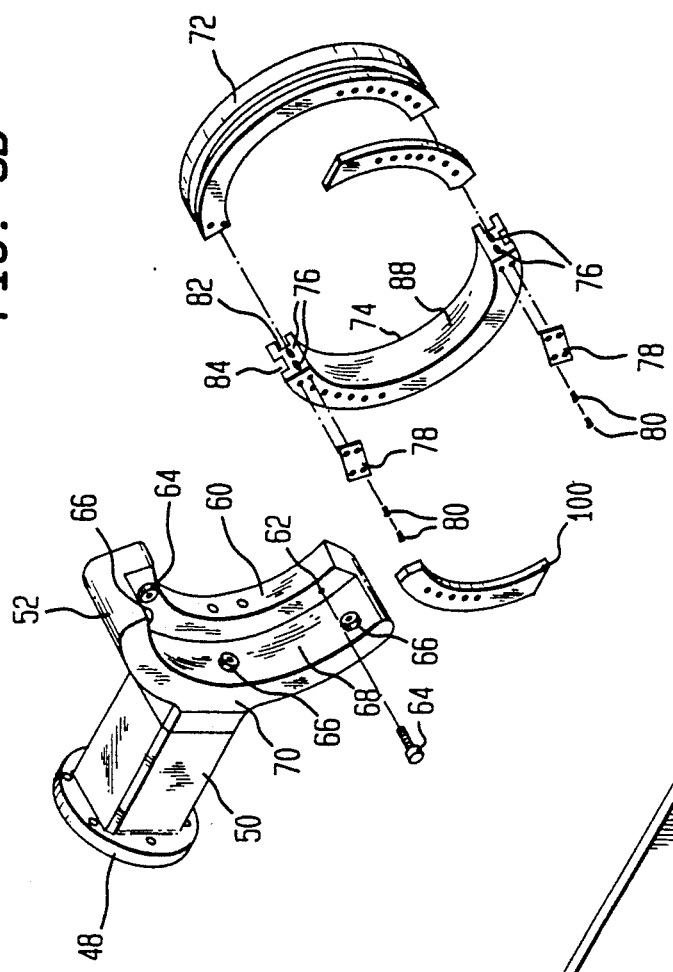

As shown in FIGS. 2b and 3b, cable pivot housing 52 only partially surrounds test head adapter ring 54. Housing 52 has a lip 60 having two holes 62 into which two horizontal cam followers 64 are inserted (in the x-direction). Perpendicular to horizontal cam followers 64, three radial cam followers 66 are inserted into the inside radial surface 68 of cable pivot housing 52. The wall 70 of housing 52 which faces test head 56 is open; wall 70 does not contain a lip or flange similar to lip 60 on the opposite side of housing 52.

Cable pivot housing 52 engages test head adapter ring 54, holding ring 54 in position, allowing ring 54 to rotate within housing 52, and transferring the location-fixing movements of positioner 12 to test head 56. Test head adapter ring 54 is formed as a split ring, generally as steel tubing, shown also in FIGS. 2b and 3b. The split ring has two ring halves, 72 and 74, which are held together by dowel pins 76. Dowel pins 76 are formed on ring half 74 and engage passages (not shown) in ring half 72. Dowel pins 76 bear a significant load because, as the load twists and turns, a cantilever force is exerted which tries to twist ring halves 72 and 74.

Ring retainers 78 are positioned over dowel pins 76, and over the junctures created when ring halves 72 and 74 are joined. Ring retainers 78 are typically held onto ring halves 72 and 74 using screws, pins, bolts, or the like 80. Thus, ring retainers 78 hold dowel pins 76 in position. Although only two ring retainers 78 are shown in FIGS. 2b and 3b, additional retainers may be provided. For example, an additional pair of ring retainers could be placed in the bottom of the guide 82. Through dowel pins 76 and ring retainers 78, ring halves 72 and 74 are fixed precisely in position.

When halves 72 and 74 are joined, guide 82 is formed around the outside of test head adapter ring 54 in the side opposite wall 70. Horizontal cam followers 64 engage guide 82 when ring 54 is in position inside cable pivot housing 52. Similarly, a radial groove 84 is formed around the circumference of ring 54. Groove 84 engages radial cam followers 66 when ring 54 is in position inside housing 52.

Unlike the known split ring, test head adapter ring 54 is open. In the conventional, "closed" split ring, wall 70 has a lip corresponding to the lip 60 on the opposite wall. Like lip 60, that lip carries two horizontal cam followers (opposite cam followers 64). A guide opposite guide 82 is formed around the outside of test head adapter ring 54 in the side adjacent to wall 70. The horizontal cam followers opposite followers 64 engage that opposite guide when ring 54 is in position inside cable pivot housing 52. Thus, the conventional split ring has neither a radial groove 84 nor radial cam followers 66.

Horizontal cam followers 64 and radial cam followers 66 are standard hardware, forming complete units containing needle bearings. Such cam followers are inexpensive relative to the big-diameter ball bearings previously used in conventional cable pivot arrangements, although they are as useful in high-load carrying parts such as test head adapter ring 54.

According to the present invention, two horizontal cam followers 64 and three radial cam followers 66 are preferable. The horizontal cam followers 64 are disposed perpendicular to the radial cam followers 66. Moreover, the two horizontal cam followers 64 and two of the three radial cam followers 66 are linearly disposed along imaginary, intersecting lines, with the third radial cam follower 66 disposed midway between the two horizontal-radial cam follower pairs.

Such an arrangement of the cam followers is advantageous because it minimizes alignment tolerance requirements. In order to share the cantilever load imposed on test head adapter ring 54, the cam followers must be in line. If three horizontal cam followers 64 were used, for example, they would not only have to be critically perpendicular to the radial cam followers 66, but they would have to be in line so that they properly shared the load. Because only two horizontal cam followers 64 are used, their perpendicularity is not as critical and alignment tolerances are more easily met.

Test head 56 may be mounted to test head adapter ring 54 in a variety of ways. Three embodiments of the attachment between the test head 56 and the ring 54 are illustrated in the drawing. Turning first to FIG. 2b, a test head mount 86 can be affixed to the inside surface 88 of test head adapter ring 54. Radial screws, pins, or the like 90 engaging passages 92 in test head mount 86 may be used to position test head mount 86. A rod 94, affixed to test head 56 on one end, is attached to (and may be integral with) test head mount 86. Rod 94 extends beyond test head mount 86 and attaches to cable support 58 on its opposite end.

Figure 3A:
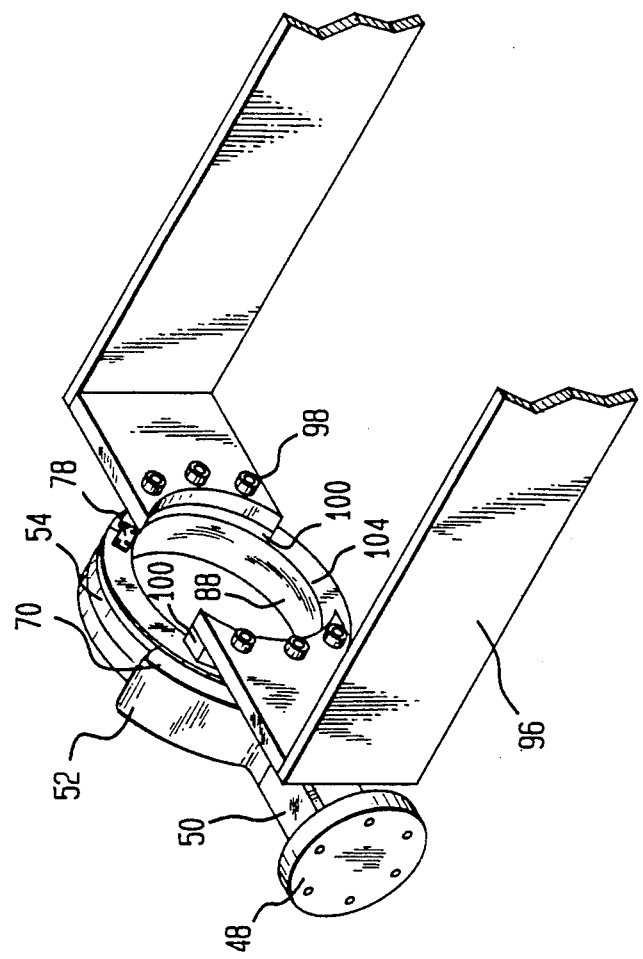
FIG. 3a is a perspective view of the test head adapter ring support structure, and of a second embodiment of the attachment between the test head and the ring, of a device testing system constructed in accordance with the present invention.

FIG. 3a shows an alternative attachment between the test head 56 and the test head adapter ring 54. In that embodiment, a cradle, harness, or yoke 96 supporting test head 56 is attached directly to ring 54 without using additional structure such as test head mount 86 and rod 94. Conventional screws, bolts, pins, or the like 98 may be used to attach the elements. As shown in FIG. 3b, spacers 100 may be provided between ring 54 and yoke 96 to prevent the formation of pinch points between cable pivot housing 52 and yoke 96 during rotation.

FIG. 4 illustrates a third embodiment of the attachment between the test head 56 and the test head adapter ring 54. A projection 102 is formed on test head 56. Projection 102 can be attached, by conventional means, directly to ring 54.

In both the second (FIG. 3a) and third (FIG. 4) embodiments discussed above, test head 56 is mounted directly to the face 104 of test head adapter ring 54 which most closely abuts test head 56. The known split ring cable pivot permits mounting only to the inside surface 88 of the cable pivot, in a manner like the first embodiment shown in FIG. 2a. This is because the known cable pivot is closed, whereas wall 70 of cable pivot housing 52 of the present invention is open, allowing access to face 104 of test head adapter ring 54.

Theoretically, it would be possible to attach test head 56 directly to face 104 of test head adapter ring 54 in the known split ring cable pivot—if the thickness of face 104 were sufficiently large. Face 104 would have to extend beyond the lip formed on wall 70 so that face 104 would be exposed. Moreover, because a circumferential guide is formed in face 104 in the known split ring cable pivot, the thickness of face 104 would have to be sufficient to allow for both formation of the guide and the attachment of test head 56.

The thickness of face 104 is critical to the overall geometry of the system, however, and must be minimized. Thus, it is not possible to attach test head 56 directly to face 104 of test head adapter ring 54 in the known split ring cable pivot. The outside diameter of ring 54 must be smaller than the thickness of test head 56 so that the center of gravity of the cantilever load passes through the center of ring 54. Moreover, the outside diameter must be kept small, particularly so that ring 54 is below the top surface of the docking plate positioned on top of test head 56, to prevent interference with docking to large handlers. Given the constraints on the outside diameter of test head adapter ring 54, the inside diameter of ring 54 is reduced as the thickness of face 104 is increased; but that inside diameter must be sufficient to pass the relatively large cable to test head 56. By providing an open cable pivot housing 52, the present invention can incorporate a thinner face 104 yet achieve the consequent mounting advantage.

For acceptable handling, it is very important that the cantilever load created by, among other components, the cable and test head 56, be balanced in test head adapter ring 54. The center of gravity ($C_g$) of the cantilever load may not be symmetrically aligned if, for example, the cable does not connect to test head 56 symmetrically about the $C_g$ (note that the cable may be attached at an edge of test head 56 in certain designs). Such misalignment can exacerbate the balancing difficulty.

FIG. 1 shows one way in which balancing is achieved. A spring assembly 106 is attached through spring housing 108 to wrist housing 36. Inside housing 108, two, separate springs are provided to compensate for the cantilever load. On the load side of cable pivot housing 52 (in the positive x-direction), spring housing 108 contains a disc spring (not shown). That disc spring is guided by a piston (also not shown) and installed by a disc spring screw 110. A gimbal pin 112 connects the disc spring and piston assembly of spring assembly 106 to wrist assembly 22. Opposite the load side of cable pivot housing 52 (in the negative x-direction), spring housing 108 contains a coil spring (not shown). That coil or compression spring is guided by a piston (also not shown) and adjusted by a coil spring screw 114. A gimbal pin (not shown) connects the coil spring and piston assembly of spring assembly 106 to wrist assembly 22. The coil spring is used for calibration, to compensate for tolerance inherent in the disc spring.

Figure 5:
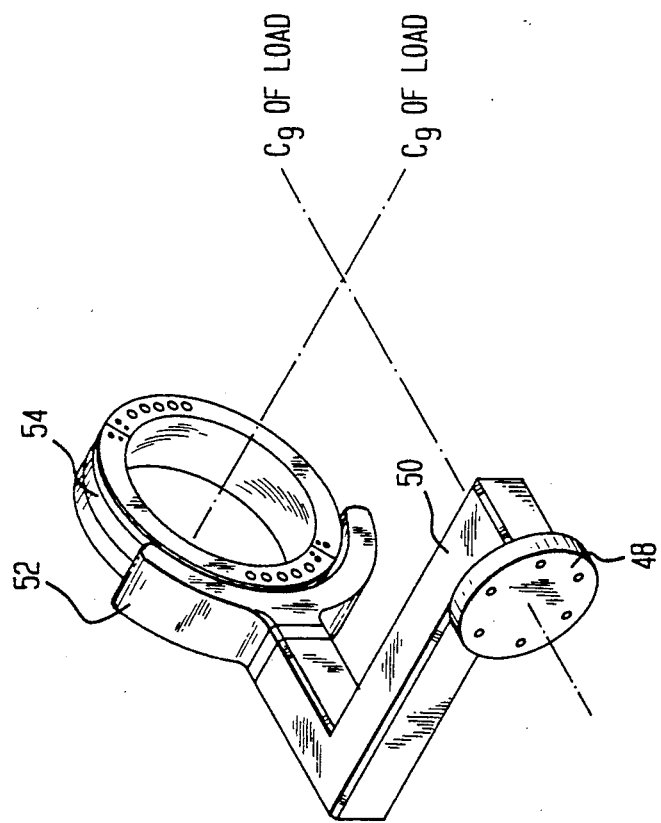
FIG. 5 is a perspective view of the test head adapter ring support structure having an offset holding arm.

The embodiments of the present invention shown in FIGS. 1, 2a and 2b, 3a and 3b, and 4 use spring assembly 106 to balance the cantilever load. That load may also be balanced, without using a spring assembly, by providing test head adapter ring 54 in an offset position, as shown in FIG. 5. To assure that the center of gravity of the load passes through the center of ring 54 in the x-direction and through the center of flange 48 in the z-direction, beam 50 is formed in a z-shaped configuration. Alternatively, the load may be balanced without using a spring assembly by establishing a $C_g$ pivot in the $C_g$ axis through the arms of yoke 96 shown in FIG. 3a.

Not illustrated in the drawing, but usually present as part of the cable pivot of the present invention, is a conventional cable pivot lock knob. Such a lock knob is typically placed in cable pivot housing 52 and can engage test head adapter ring 54 to lock ring 54 in position.

Although the invention is illustrated and described herein as embodied in a device testing system, which comprises a support structure, a positioner, a cable pivot housing defining a substantially circular passage completely open on one side, a split test head adapter ring, a test head, a test cabinet, a cable, and a cable support, it is nevertheless not intended to be limited to the details shown. Rather, various modifications may be made in the details within the scope and range of equivalents of the claims and without departing from the spirit of the invention. Specifically, and for example, the test head adapter ring is shown as split into two halves; it may be split into a number of different sections.

What is claimed is:

1. A device testing system for evaluating electronic devices comprising:
   a movable positioner;
   a semi-circular cable pivot housing including an inside radial surface defining a substantially circular passage and a lip on only one side of said housing so that said passage is partly closed on said one side and completely open on the opposite side;
   means for attaching said cable pivot housing to said positioner,
   a test head adapter ring having a first half and a second half;
   means for connecting said first half of said test head adapter ring to said second half of said test head adapter ring;
   means for rotatably positioning said test head adapter ring in said substantially circular passage of said cable pivot housing;
   a test head;
   means for attaching said test head to said test head adapter ring for pivotal movement of said test head; and
   a cable connected to said test head and passing through said test head adapter ring.

2. A device testing system as claimed in claim 1 wherein said connecting means include:
   (a) a pair of edges each having a plurality of passages on said first half of said test head adapter ring,
   (b) a corresponding plurality of dowel pins formed on said second half of said test head adapter ring for engaging said passages and forming a joint where said first half and said second half of said test head adapter ring connect, and
   (c) at least one pair of ring retainers affixed to said test head adapter ring over said joint and holding said dowel pins in said passages.

3. A device testing system as claimed in claim 1 wherein said rotatable positioning means include:
   (a) a face of said test head adapter ring adjacent said lip on said one side of said cable pivot housing having a guide formed in said face,
   (b) a circumference of said test head adapter ring having a radial groove,
   (c) a plurality of horizontal cam followers positioned on said lip of said cable pivot housing for engaging said guide, and
   (d) a plurality of radial cam followers positioned on said inside radial surface of said cable pivot housing for engaging said radial groove.

4. A device testing system as claimed in claim 3 wherein said horizontal cam followers are positioned perpendicular to said radial cam followers.

5. A device testing system as claimed in claim 4 wherein there are two horizontal cam followers and three radial cam followers.

6. A device testing system as claimed in claim 5 wherein said two horizontal cam followers and two of said three radial cam followers are linearly disposed along imaginary intersecting lines.

7. A device testing system as claimed in claim 1 wherein said attachment means include:
   (a) an inside surface formed on said test head adapter ring,
   (b) a test head mount affixed to said inside surface of said test head adapter ring, and
   (c) a rod affixed to said test head on one end and engaging said test head mount.

8. A device testing system as claimed in claim 1 wherein said attachment means includes a yoke supporting and at least partially enclosing said test head attached directly to said test head adapter ring.

9. A device testing system as claimed in claim 1 wherein said attachment means includes a projection formed on said test head and connected directly to said test head adapter ring.

10. A device testing system as claimed in claim 1 wherein the outside diameter of said test head adapter ring is smaller than the thickness of said test head.

11. A device testing system as claimed in claim 1 wherein the center of gravity of the cantilever load carried by said test head adapter ring passes through the center of said split ring cable pivot.

* * * * *